United States Patent
Bhattacharjee et al.

(12) 
(10) Patent No.: US 6,952,132 B2
(45) Date of Patent: Oct. 4, 2005

(54) METHOD AND APPARATUS FOR AUTOMATIC GAIN CONTROL

(75) Inventors: Jishnu Bhattacharjee, San Jose, CA (US); Debanjan Mukherjee, San Jose, CA (US); Abhijit Phanse, Sunnyvale, CA (US)

(73) Assignee: Scintera Networks, Inc., San Jose, CA (US)

(*) Notice: Subject to any disclaimer, the term of this patent is extended or adjusted under 35 U.S.C. 154(b) by 43 days.

(21) Appl. No.: 10/724,444

(22) Filed: Nov. 26, 2003

(65) Prior Publication Data

US 2005/0110566 A1 May 26, 2005

(51) Int. Cl.[7] .............................................. H03G 3/20
(52) U.S. Cl. ...................... 330/140; 330/129; 330/278
(58) Field of Search ................................ 330/140, 129, 330/279, 278

(56) References Cited

U.S. PATENT DOCUMENTS

| | | | | |
|---|---|---|---|---|
| 4,870,370 A | * | 9/1989 | Hedberg et al. | 330/133 |
| 5,901,347 A | * | 5/1999 | Chambers et al. | 455/234.1 |
| 5,917,865 A | * | 6/1999 | Kopmeiners et al. | 375/345 |
| 6,417,730 B1 | * | 7/2002 | Segallis et al. | 330/129 |
| 6,843,597 B1 | * | 1/2005 | Li et al. | 1/1 |

* cited by examiner

*Primary Examiner*—Patricia Nguyen
(74) *Attorney, Agent, or Firm*—MacPherson Kwok Cho & Heid LLP; Greg J. Michelson

(57) ABSTRACT

Systems and methods provide automatic gain control, such as by employing analog and digital techniques. For example, overall gain may be controlled through coarse and fine control signals provided to gain stages, with the overall gain monitored via a power detector circuit.

27 Claims, 8 Drawing Sheets

METHOD AND APPARATUS FOR AUTOMATIC GAIN CONTROL

TECHNICAL FIELD

The present invention relates generally to electrical circuits and, more particularly, to techniques for automatic gain control.

BACKGROUND

Automatic gain control is employed in a variety of applications, for example, to adjust gain as a function of an input signal or other parameters. A typical automatic gain control (AGC) circuit utilizes only analog techniques to control gain, such as for example by varying a bias current or a load resistance. Consequently, these types of AGC circuits are generally limited in their allowable linear dynamic range and/or speed of operation.

A conventional AGC circuit may also employ a peak amplitude detection circuit to sense an output signal amplitude level of the AGC circuit. A drawback of a typical peak amplitude detection circuit is its limited speed of operation, which generally limits the overall speed of operation for the AGC circuit. As a result, there is a need for improved techniques for automatic gain control.

SUMMARY

Systems and methods are disclosed herein to provide automatic gain control. For example, in accordance with an embodiment of the present invention, an automatic gain control (AGC) system is disclosed. The AGC system may employ analog and digital techniques to achieve high-speed AGC having a high linear dynamic range. An overall gain of the AGC system may be controlled through coarse and fine control signals, with the gain monitored via a power detector circuit. Furthermore, the AGC system may be calibrated, for example, to account for process, voltage, and temperature variations.

More specifically, in accordance with one embodiment of the present invention, an automatic gain control system includes an automatic gain control core circuit adapted to apply a gain to an input signal to provide an output signal; a power detector circuit adapted to receive the output signal and provide a first signal which indicates a power level of the output signal; and a processor adapted to control the gain of the automatic gain control core circuit based on the first signal.

In accordance with another embodiment of the present invention, an automatic gain control circuit includes an amplifier adapted to apply a gain to an input signal to provide an output signal; a detector adapted to receive the output signal and provide a first signal based on the output signal; and a processor adapted to provide a coarse gain control signal and a fine gain control signal to the amplifier based on the first signal to control the gain of the amplifier, wherein the processor determines a reference level value for the output signal by providing a calibration signal to the detector and setting the reference level value based on the first signal.

In accordance with another embodiment of the present invention, a method of providing automatic gain control includes providing a gain to an input signal to provide an output signal; monitoring a power level of the output signal; and providing a coarse gain control and a fine gain control to control the gain based on the monitoring to maintain the output signal within a desired signal level range.

In accordance with another embodiment of the present invention, a method of calibrating and monitoring an automatic gain control circuit includes providing a calibration signal whose signal level is estimated to provide a reference value; setting a range for an output signal based on the reference value; providing a gain to an input signal to provide the output signal; monitoring an output signal level of the output signal; and adjusting a coarse gain of the gain to maintain the output signal within the range.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
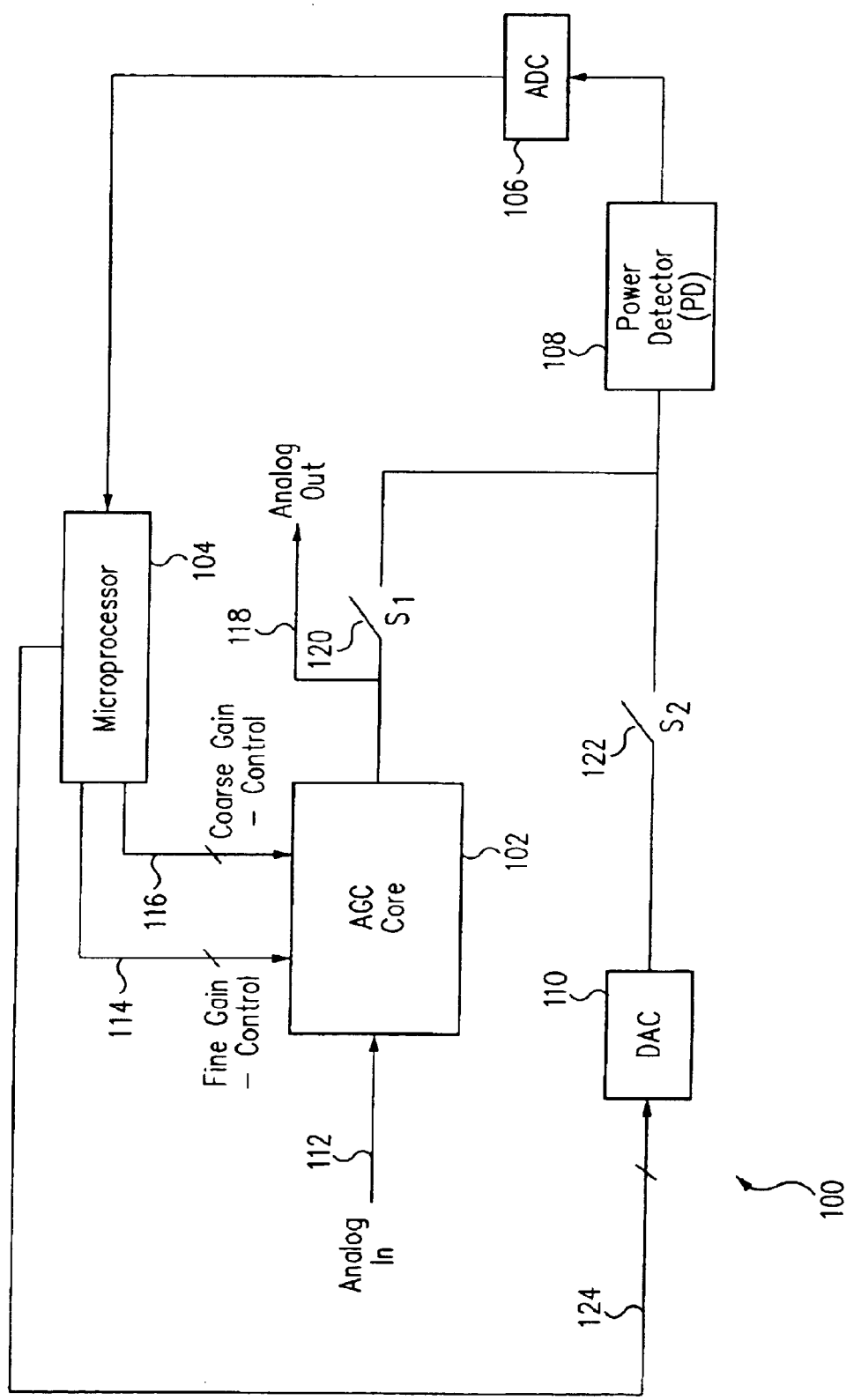
FIG. 1 shows a block diagram illustrating an automatic gain control system in accordance with an embodiment of the present invention.

FIG. 1 shows a block diagram illustrating an automatic gain control system 100 in accordance with an embodiment of the present invention. System 100 may be viewed as a mixed signal system, which utilizes analog and digital signals to perform its intended function of automatic gain control. System 100 includes an automatic gain control (AGC) core 102, a processor 104, an analog-to-digital converter (ADC) 106, a power detector (PD) 108, a digital-to-analog converter (DAC) 110, and switches 120 and 122 (labeled S1 and S2, respectively).

AGC core 102 provides a gain (i.e., amplifies or attenuates) to an input signal 112 (e.g., an analog signal) to provide an output signal 118 (e.g., an analog signal), which is an amplified or attenuated version of input signal 112. Input signal 112 and output signal 118 may represent, for example, a signal having a variable amplitude and a signal having an approximately fixed (desired) amplitude, respectively. PD 108 senses an average power level of output signal 118 when switch 120 is closed and switch 122 is open and is utilized for calibration purposes of system 100 when switch 120 is open and switch 122 is closed. ADC 106 converts a signal received from PD 108 and provides the converted signal to processor 104.

Alternatively, in accordance with an embodiment of the present invention, a conventional peak detector circuit may be substituted for PD 108. Consequently, rather than measure an average power level, a peak amplitude of output signal 118 is determined and utilized in a similar fashion as is explained herein for a power level indication from PD 108.

Processor 104 (e.g., a microprocessor) monitors and controls certain functions of system 100. Processor 104 controls switches 120 and 122 (e.g., transistors) to place system 100 in the desired mode, a calibration mode and a continuous AGC mode, as explained further herein. Processor 104 also receives the converted signal from ADC 106 and provides control signals 114 and 116 (fine and coarse gain control, respectively) to adjust a gain of AGC core 102. Processor 104 further provides a signal 124 to DAC 110 during the calibration mode to calibrate PD 108.

Processor 104 may place system 100 into the calibration mode (i.e., self-calibration mode) by closing switch 122 and opening switch 120 or into the continuous AGC mode by opening switch 122 and closing switch 120. In the calibration mode, processor 104 calibrates PD 108 by providing a selected digital word (e.g., corresponding to the desired reference level of output signal 118) via signal 124 to DAC 110, which provides an analog equivalent of signal 124 to PD 108. PD 108 provides its output signal to ADC 106, which provides the converted signal to processor 104.

The converted signal from ADC 106, in the calibration mode, represents a reference level value (referred to herein as "ref") of the output signal from PD 108 corresponding to the selected digital word provided by processor 104. Processor 104 may then store the reference level value (ref) and compute desired boundaries (referred to herein as "refmin" and "refmax") around the reference level value (ref) to be utilized during the continuous AGC mode.

Processor 104 transitions from the calibration mode to the continuous AGC mode by opening switch 122 and closing switch 120. In the continuous AGC mode, PD 108 continuously monitors output signal 118 and provides its information to processor 104 via ADC 106. Processor 104 adjusts a gain of AGC core 102 to maintain output signal 118 within a desired signal level range (e.g., power level between refmin and refmax).

Figure 2:
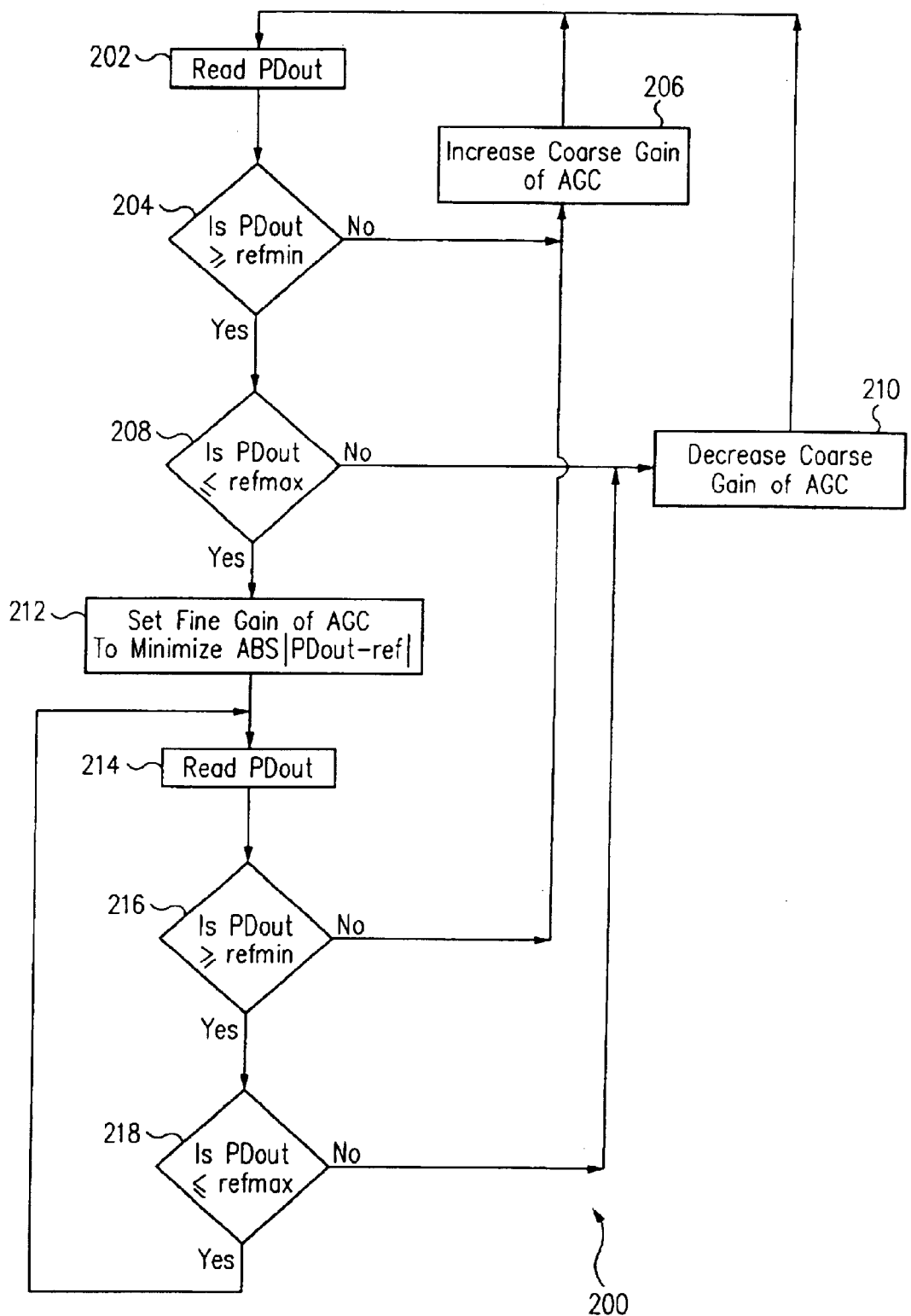
FIG. 2 shows a flowchart illustrating an exemplary operational flow for the automatic gain control system of FIG. 1 in accordance with an embodiment of the present invention.

As an example, FIG. 2 shows a flowchart 200 illustrating an exemplary operational flow for the continuous AGC mode of system 100 in accordance with an embodiment of the present invention. Processor 104 reads a value (PDout) provided by PD 108 via ADC 106 (step 202) and increases a coarse gain of AGC core 102 (step 206) via control signal 116 (coarse gain control) if the value (PDout) is not greater than or equal to a determined lower boundary (refmin) for output signal 118 (step 204) or decreases a coarse gain of AGC core 102 (step 210) via control signal 116 if the value (PDout) is not less than or equal to a determined upper boundary (refmax) at step 208.

If the value (PDout) is within the desired boundaries, then processor 104 sets a fine gain of AGC core 102 (step 212) via control signal 114 (fine gain control), such as for example to minimize the absolute power of output signal 118 (i.e., to minimize abs|PDout-ref|). Processor 104 reads another value (PDout) provided by PD 108 via ADC 106 (step 214) and increases a coarse gain of AGC core 102 (step 206) if the value (PDout) is not greater than or equal to the lower boundary (refmin) at step 216 or decreases a coarse gain of AGC core 102 (step 210) if the value (PDout) is not less than or equal to the upper boundary (refmax) at step 218. Processor 104 continues to fine tune a coarse gain and a fine gain of AGC core 102 as required to maintain output signal 118 within a desired range.

System 100, in accordance with an embodiment of the present invention, utilizes analog and digital techniques to achieve high-speed automatic gain control for an input signal having a high linear dynamic range. For example, system 100 may provide a linear analog output signal of a desired signal level from an analog input signal having a high dynamic amplitude range. The desired signal level which the output signal will settle to may be auto-calibrated to account for process, voltage, and temperature variations.

Figure 3:
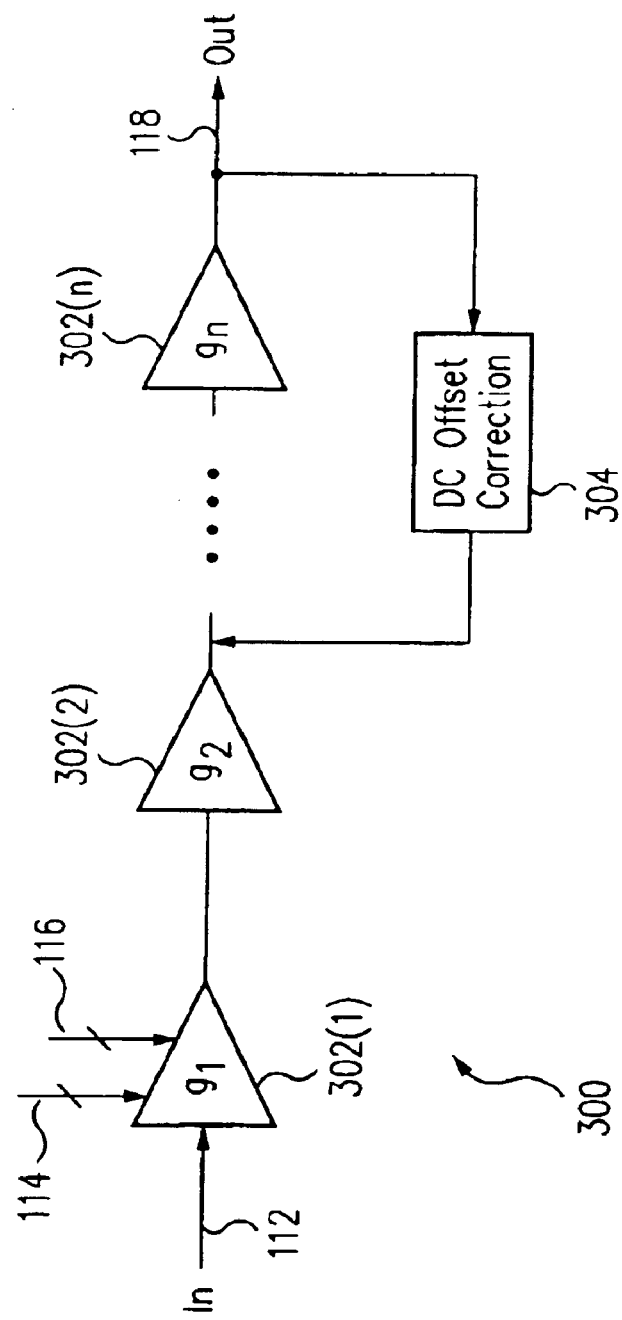
FIG. 3 shows a block diagram illustrating an exemplary implementation for a portion of the automatic gain control system of FIG. 1 in accordance with an embodiment of the present invention.

System 100 may be designed to monitor (e.g., at a multi-gigahertz rate) output signal 118 of AGC core 102. For example, FIG. 3 shows a block diagram of an AGC core 300 illustrating an exemplary implementation for AGC core 102 of FIG. 1 in accordance with an embodiment of the present invention. AGC core 300 includes a number of gain stages 302 (e.g. $g_1, g_2, \ldots, g_n$, where "n" represents the number of desired gain stages 302), with the number of gain stages 302 depending upon the desired overall gain or the gain requirement of AGC core 300.

Each gain stage 302 receives control signals 114 and 116 (e.g., a p-bit fine control bus signal and an m-bit coarse control bus signal, respectively, where "p" and "m" are the desired number of bits to provide the desired degree of control) to provide fine and coarse gain control within the particular gain stage. Thus, the overall gain of AGC core 300 may be divided among gain stages 302(1) through 302(n) (i.e., each gain stage 302, such as gain stage 302(2), may contribute a portion of the overall gain) to obtain a quasi-distributed circuit structure, which may help in maximizing bandwidth. AGC core 300 may also include a direct current (DC) offset correction 304, which provides feedback from output signal 118 to an output terminal of an intermediate gain stage (e.g., an output terminal of gain stage 302(2)) to adjust (e.g., minimize) a DC offset value of output signal 118.

Figure 4:
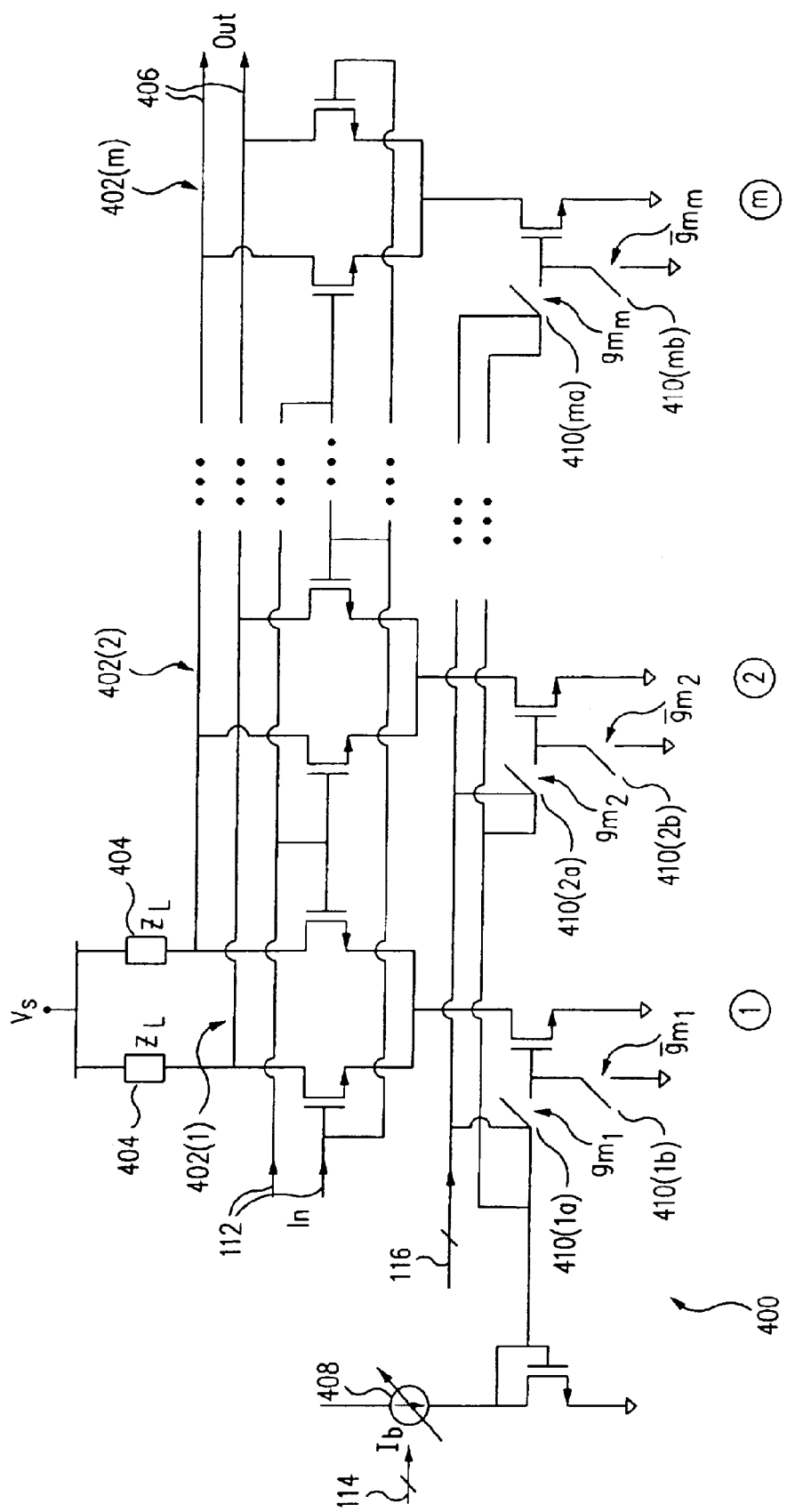
FIG. 4 shows a circuit diagram illustrating an exemplary circuit implementation for a portion of the block diagram of FIG. 3 in accordance with an embodiment of the present invention.

FIG. 4 shows a circuit 400 illustrating an exemplary circuit implementation for one of gain stages 302 (e.g., gain stage 302(1)) of FIG. 3 in accordance with an embodiment of the present invention. Circuit 400 includes a number of digitally-switched transconductance ($g_m$) stages 402 (e.g., stages 402(1), 402(2), ..., 402(m), where "m" corresponds to the number of desired stages and also the number of bits required from control signal 116 for coarse gain control).

Each stage 402 includes a pair of switches 410 (e.g., switches 410(1a) and 410(1b), 410(2a) and 410(2b), through 410(ma) and 410(mb) corresponding to stage 402(1), stage 402(2), through stage 402(m), respectively) which provide coarse control gain for circuit 400. Control signal 116, which includes "m" bits or bits $g_{m1}$ through $g_{mm}$, provides coarse gain control by controlling switches 410 (e.g., $g_m$ switches) within circuit 400.

For example, if a first bit ($g_{m1}$) of control signal 116, corresponding to stage 402, is asserted, then switch 410(1a) is closed and switch 410(1b) is opened so that stage 402(1)

provides its gain to input signal 112. If the first bit ($g_{m1}$) of control signal 116 is deasserted, then switch 410(1*a*) is opened and switch 410(1*b*) is closed so that stage 402(1) does not provide its gain to input signal 112. Similarly, a second bit ($g_{m2}$) through to the last bit (m-bit or $g_{mm}$) of control signal 116 controls corresponding switches 410(2*a*, 2*b*) to 410(*ma, mb*) of corresponding stages 402(2) to 402(*m*) to provide the desired coarse gain for an output signal 406. Output signal 406 may represent output signal 118 or, if it exists, the following circuit 400 (e.g., the next gain stage 302).

Control signal 114 (fine gain control) controls a current source 408 (e.g., a digitally-controlled current source) to control a bias current provided (e.g., mirrored) for each stage 402 to provide fine gain control to circuit 400. The combination of coarse and fine gain control enables precise gain control to maintain an approximately constant gain linearity across a wide dynamic range for input signal 112.

Figure 5A:
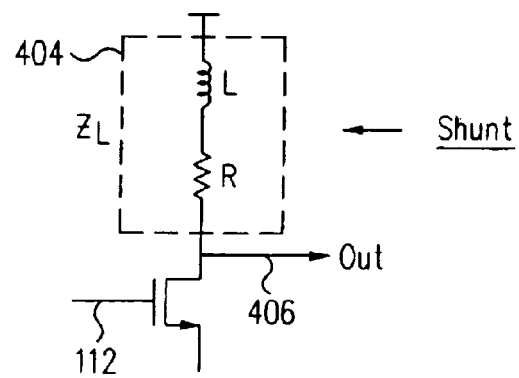
FIGS. 5a through 5g show circuit diagrams illustrating exemplary implementations for a portion of the circuit diagram of FIG. 4 in accordance with an embodiment of the present invention.

Circuit 400 also includes load impedances 404, which may be optimized through appropriate broad-banding techniques to further enhance the bandwidth. As an example, FIGS. 5*a* through 5*g* show corresponding circuits illustrating exemplary implementations for load impedance 404 of FIG. 4 in accordance with an embodiment of the present invention. For example, FIG. 5*a* illustrates a shunt (or shunt-peaked) load configuration for load impedance 404 having a resistor (R) in series with an inductor (L). Also shown in FIG. 5*a* and the following FIGS. 5*b* through 5*g* are the coupling relationships of output signal 406 relative to the exemplary implementations of load impedance 404 and also relative to a portion of stage 402 showing a transistor of stage 402 receiving input signal 112.

Figure 5B:
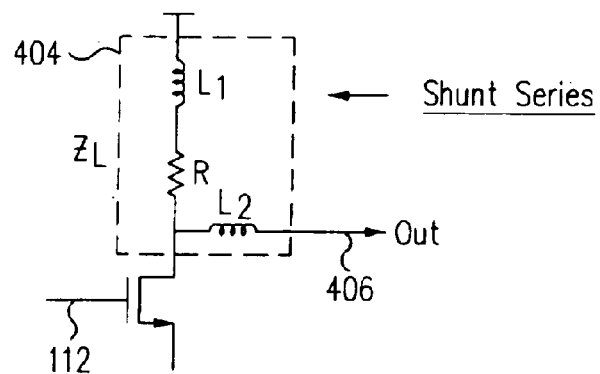
Figure 5C:
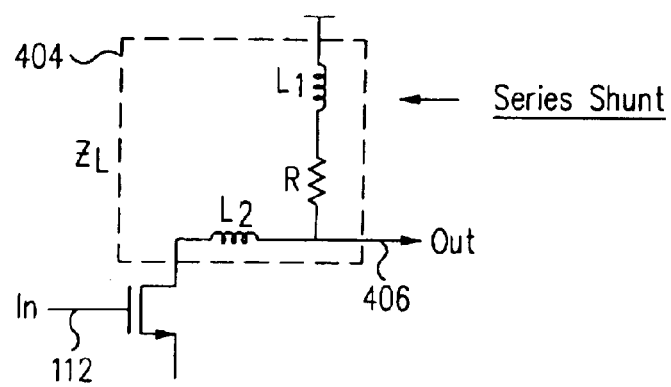
Figure 5D:
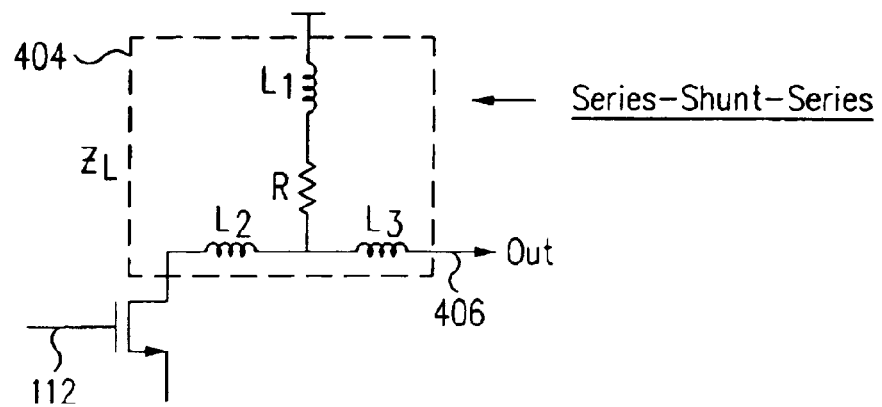
Figure 5E:
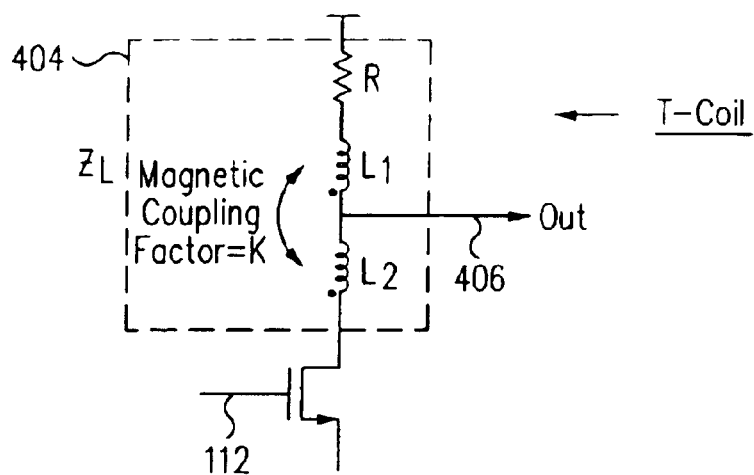
Figure 5F:
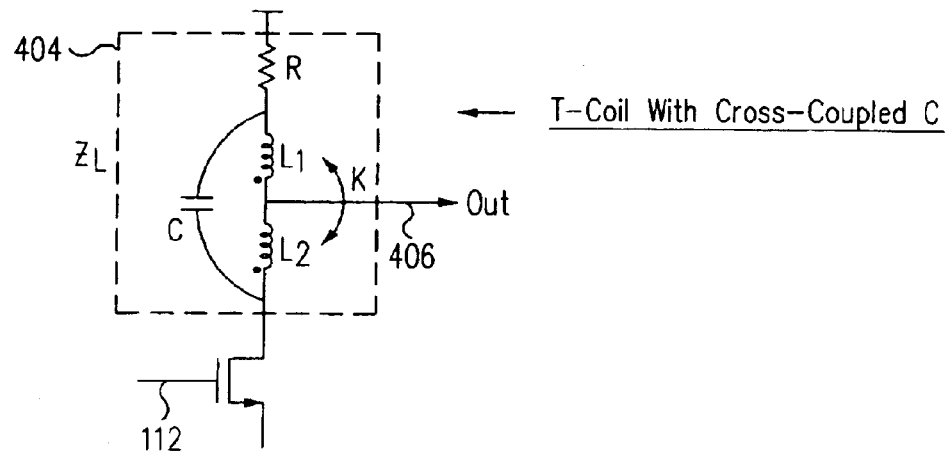
Figure 5G:
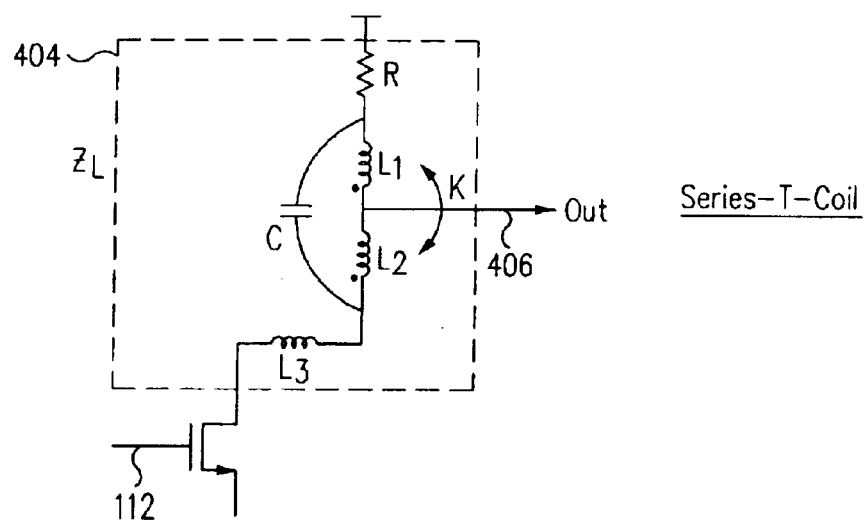

FIGS. 5*b* and 5*c* illustrate a shunt-series and a series-shunt load configuration, respectively, for load impedance 404 having inductors ($L_1$ and $L_2$) coupled to resistor (R) as shown. FIG. 5*d* illustrates a series-shunt-series load configuration for load impedance 404 having inductors ($L_1$, $L_2$, and $L_3$) coupled to resistor (R) as shown. FIGS. 5*e* and 5*f* illustrate a T-coil and a T-coil with cross-coupled capacitor (C) load configuration, respectively, for load impedance 404 having inductors ($L_1$ and $L_2$) with associated magnetic coupling factor (K). FIG. 5*g* illustrates a series-T-coil load configuration for load impedance 404 having resistor (R), cross-coupled capacitor (C), inductor ($L_3$), and inductors ($L_1$ and $L_2$) with associated magnetic coupling factor (K).

In general, different types of broad-banding loads can be utilized for bandwidth extension per design requirements or desired application. The transconductance stages 402 (i.e., transconductance cell) in combination with broad-band loads enables wide linear dynamic range with high bandwidth (e.g., multi-gigahertz). Further details regarding transconductance cells, including exemplary implementations suitable for each gain stage 302, may be found in U.S. patent application Ser. No. 10/724,449 entitled "Digitally Controlled Transconductance Cell" and filed Nov. 26, 2003, which is incorporated herein by reference in its entirety.

Figure 6:
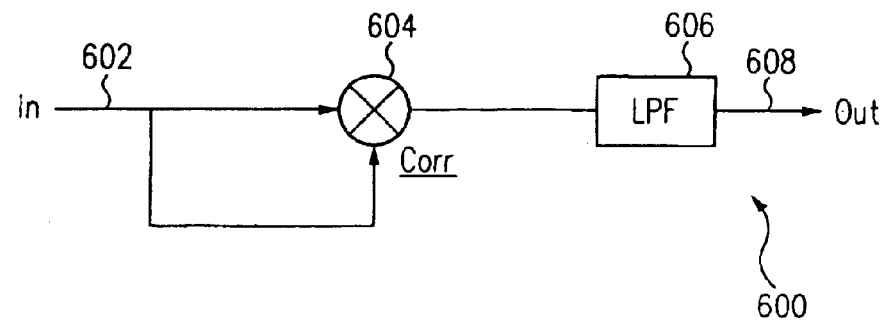
FIG. 6 shows a block diagram illustrating an exemplary implementation for a portion of the automatic gain control system of FIG. 1 in accordance with an embodiment of the present invention.

FIG. 6 shows a block diagram of a power detector 600, which is an exemplary implementation for PD 108 of FIG. 1 in accordance with an embodiment of the present invention. Power detector 600 includes a correlator 604 followed by a low pass filter 606 to receive an input signal 602 (e.g., from AGC core 102 or DAC 110) and provide an output signal 608 (e.g., to ADC 106). Power detector 600 senses an average power signal level of input signal 602.

Figure 7:
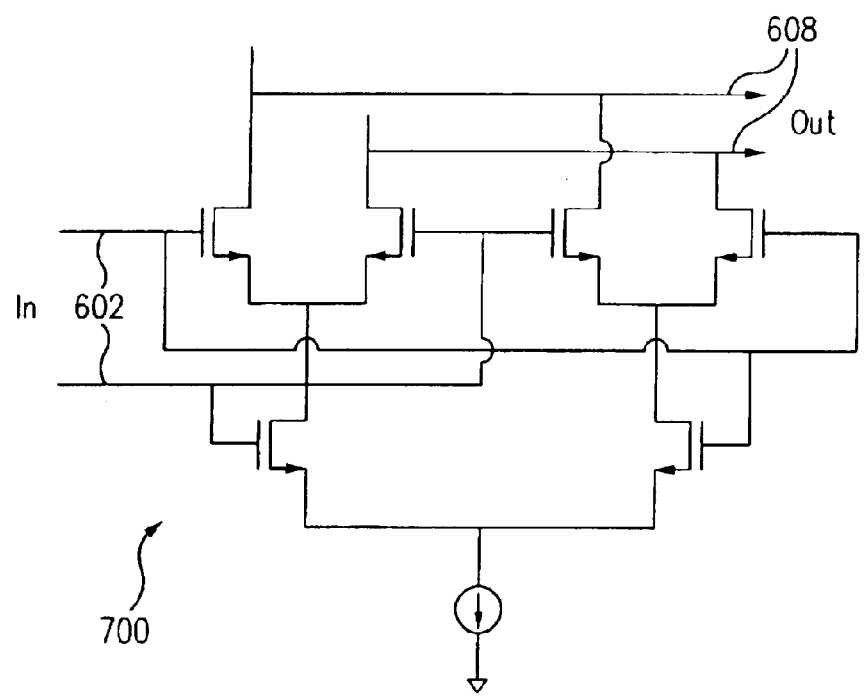
FIG. 7 shows a circuit diagram illustrating an exemplary circuit implementation for a portion of the block diagram of FIG. 6 in accordance with an embodiment of the present invention.

FIG. 7 shows a circuit 700 illustrating an exemplary circuit implementation for correlator 604 of FIG. 6 in accordance with an embodiment of the present invention. Circuit 700 is a high-speed correlator (sometimes referred to as a Gilbert cell multiplier). Thus, PD 108 of FIG. 1 may be constructed with a high-speed correlator cell whose speed of operation may be significantly greater than conventional techniques (e.g., peak amplitude detection circuits).

In accordance with one or more embodiments of the present invention, systems and methods are disclosed for providing automatic gain control. For example, utilizing one or more of the techniques disclosed herein, ultra-wide linear dynamic range automatic gain control may be achieved at a high speed (e.g., 10 GHz) of operation. In accordance with one embodiment, a power-detect circuit is employed in an AGC circuit rather than a peak amplitude detect circuit found in conventional devices. Furthermore, the AGC circuit may be employed as a mixed-signal architecture as opposed to an entirely analog approach. For example, the AGC circuit may utilize gain stages that have digitally-switched transconductance cells. Overall, by utilizing one or more of the techniques discussed herein, a broadband (e.g., multi-gigahertz bandwidth) AGC circuit may be designed having a reduced input sensitivity level and/or higher speed of operation than typical AGC circuits.

Embodiments described above illustrate but do not limit the invention. It should also be understood that numerous modifications and variations are possible in accordance with the principles of the present invention. Accordingly, the scope of the invention is defined only by the following claims.

We claim:

1. An automatic gain control system comprising:
   an automatic gain control core circuit adapted to apply a gain to an input signal to provide an output signal;
   a power detector circuit adapted to receive the output signal and provide a first signal which indicates a power level of the output signal; and
   a processor adapted to control the gain of the automatic gain control core circuit based on the first signal, wherein the processor provides a calibration signal to the power detector circuit to calibrate a reference level for the system.

2. The system of claim 1, further comprising an analog-to-digital converter adapted to receive the first signal from the power detector circuit and provide the first signal as a digital signal to the processor.

3. The system of claim 1, further comprising a digital-to-analog converter adapted to receive the calibration signal and provide the calibration signal as an analog signal to the power detector circuit.

4. The system of claim 1, further comprising:
   a first switch, coupled between the processor and the power detector circuit, adapted to be closed by the processor during a calibration mode of the system to calibrate the reference level; and
   a second switch, coupled between the automatic gain control circuit and the power detector circuit, adapted to be closed by the processor during a continuous automatic gain control mode of the system.

5. The system of claim 1, wherein the power detector circuit comprises:
   a correlator; and
   a low pass filter coupled to the correlator to determine the power level of the output signal.

6. The system of claim 1, wherein the processor provides a coarse gain control signal and a fine gain control signal to the automatic gain control core circuit to control the gain.

7. The system of claim 6, wherein the automatic gain control core circuit comprises a plurality of gain stages, with each of the gain stages having a plurality of transconductance stages.

8. The system of claim 7, wherein the fine gain control signal controls a bias current value for the transconductance stages, and the coarse gain control signal selects which of the transconductance stages contribute to the gain.

9. The system of claim 7, wherein the plurality of transconductance stages for each gain stage is associated with at least one load impedance.

10. The system of claim 9, wherein the load impedance comprises a shunt, a shunt-series, a series-shunt, a series-shunt-series, a T-coil, a T-coil with a cross-coupled capacitor, or a series-T-coil.

11. An automatic gain control circuit comprising:
   an amplifier adapted to apply a gain to an input signal to provide an output signal;
   a detector adapted to receive the output signal and provide a first signal based on the output signal; and
   a processor adapted to provide a coarse gain control signal and a fine gain control signal to the amplifier based on the first signal to control the gain of the amplifier, wherein the processor determines a reference level value for the output signal by providing a calibration signal to the detector and setting the reference level value based on the first signal.

12. The circuit of claim 11, wherein the detector is a power detector and the first signal is based on an average power level of the output signal.

13. The circuit of claim 11, wherein the detector is a peak detector and the first signal is based on a peak amplitude level of the output signal.

14. The circuit of claim 11, further comprising:
   a digital-to-analog converter adapted to receive the calibration signal and provide the calibration signal as an analog signal to the detector; and
   an analog-to-digital converter adapted to receive the first signal from the detector and provide the first signal as a digital signal to the processor.

15. The circuit of claim 11, wherein the detector is a power detector comprising a low pass filter coupled to a correlator.

16. The circuit of claim 11, wherein the fine gain control signal is set to minimize an absolute value of the first signal minus a reference value.

17. The circuit of claim 11, wherein the amplifier comprises a gain stage, with the gain stage having a plurality of transconductance stages, wherein the fine gain control signal controls a bias current value for the transconductance stages and the coarse gain control signal controls which of the transconductance stages contribute to the gain of the amplifier.

18. The circuit of claim 17, wherein the plurality of transconductance stages are associated with at least one load impedance.

19. The circuit of claim 18, wherein the load impedance comprises a shunt, a shunt-series, a series-shunt, a series-shunt-series, a T-coil, a T-coil with a cross-coupled capacitor, or a series-T-coil.

20. A method of providing automatic gain control, the method comprising:
   providing a gain to an input signal to provide an output signal;
   monitoring a power level of the output signal;
   providing a calibration signal to the monitoring of the power level to calibrate a reference level for the automatic gain control; and
   providing a coarse gain control and a fine gain control to control the gain based on the monitoring to maintain the output signal within a desired signal level range.

21. The method of claim 20, wherein the monitoring estimates an average power level of the output signal.

22. The method of claim 20, further comprising calibrating the monitoring to obtain a reference level value, with the desired signal level range based on the reference level value.

23. The method of claim 20, wherein the gain is performed in stages, with the coarse gain control and the fine gain control controlling a gain of each of the stages.

24. A method of calibrating and monitoring an automatic gain control circuit, the method comprising:
   providing a calibration signal whose signal level is estimated to provide a reference value;
   setting a range for an output signal based on the reference value;
   providing a gain to an input signal to provide the output signal;
   monitoring an output signal level of the output signal; and
   adjusting a coarse gain of the gain to maintain the output signal within the range.

25. The method of claim 24, further comprising setting a fine gain of the gain to minimize an absolute value of the power level of the output signal minus the reference value.

26. The method of claim 24, wherein the monitoring estimates an average power level of the output signal.

27. The method of claim 24, wherein the monitoring estimates a peak amplitude signal level of the output signal.

* * * * *